United States Patent [19]

White et al.

[11] 4,319,954
[45] Mar. 16, 1982

[54] METHOD OF FORMING POLYCRYSTALLINE SILICON LINES AND VIAS ON A SILICON SUBSTRATE

[75] Inventors: Lawrence K. White, East Windsor; Chung P. Wu, Mercerville, both of N.J.

[73] Assignee: RCA Corporation, New York, N.Y.

[21] Appl. No.: 238,804

[22] Filed: Feb. 27, 1981

[51] Int. Cl.³ .................................. H01L 21/306
[52] U.S. Cl. ................................ 156/628; 156/644; 156/657; 156/662; 357/59; 427/86
[58] Field of Search ............... 156/628, 644, 650, 651, 156/652, 657, 653, 659.1, 661.1, 662, 643; 148/1.5, 174, 175, 176, 187; 427/86, 93; 219/121 L, 121 LM; 357/59; 29/580; 430/313, 315, 317; 252/79.3, 79.4

[56] References Cited

U.S. PATENT DOCUMENTS

| | | | |
|---|---|---|---|
| 4,074,304 | 2/1978 | Shiba | 357/59 |
| 4,179,528 | 12/1979 | Losee et al. | 429/9 |
| 4,240,843 | 12/1980 | Celler et al. | 148/1.5 |
| 4,243,433 | 1/1981 | Gibbons | 148/1.5 |

OTHER PUBLICATIONS

Appl. Phys. Lett. 35(1), Jul. 1, 1979, Crystallographic Orientation of Silicon on an Amorphous Substrate Using an Artifical Surface-Relief Grating and Laser Crystallization, by M. W. Geis et al., pp. 71-74.
IEDM Technical Digest, 1980, Mosfets Fabrication in (100) Single Crystal Silicon-on-Oxide Obtained by Laser-Induced Lateral Seeding Technique, by H. W. Lam et al., pp. 559-561.

*Primary Examiner*—William A. Powell
*Attorney, Agent, or Firm*—Birgit E. Morris; Donald S. Cohen; Sanford J. Asman

[57] ABSTRACT

The method involves the formation of conductive, polycrystalline silicon lines and vias by the conversion of amorphous silicon in contact with the underlying silicon substrate through the use of a laser annealing process.

10 Claims, 5 Drawing Figures

METHOD OF FORMING POLYCRYSTALLINE SILICON LINES AND VIAS ON A SILICON SUBSTRATE

BACKGROUND OF THE INVENTION

The present invention relates to a method of manufacturing integrated circuit devices. In particular, it relates to a method of forming polycrystalline silicon lines and vias on a patterned substrate.

In the manufacture of integrated circuit devices, polycrystalline silicon is often used to form conductive lines of the type required for interconnects and for the gates of MOS transistors. While photolithography steps are usually required to define areas where such lines will be formed, it is desirable to minimize lithographic steps during semiconductor manufacture.

SUMMARY OF THE INVENTION

In accordance with the present invention, a substrate has a layer of insulating material, such as silicon dioxide, formed thereon. The insulating material is patterned using a photolithographic process, and portions of the insulating material, where polycrystalline silicon lines are desired, are removed. Thereafter, an amorphous silicon layer is deposited over the entire substrate, and the amorphous silicon layer is subjected to a laser annealing process which causes the amorphous silicon layer to be selectively converted into a polycrystalline silicon material in the grooves and vias which had been formed in the insulating layer. The residual amorphous silicon, which overlies the insulating layer, is removed using a selective etching process which leaves behind both the insulating layer and the polycrystalline silicon lines and vias. In accordance with the present invention, a polycrystalline material is selectively deposited in areas where no silicon dioxide substrate exists, or, to a limited degree, on top of the silicon dioxide islands, and, no additional photolithography steps are required.

DETAILED DESCRIPTION OF AN EXEMPLARY EMBODIMENT

Figure 1:
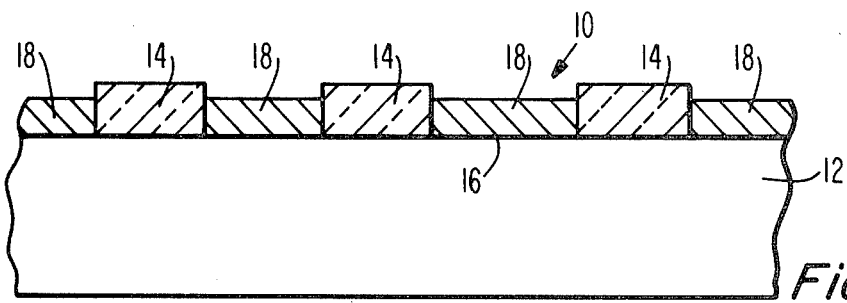
FIG. 1 is a cross-sectional view of a device formed in accordance with the present invention.

Referring now to FIG. 1, a portion of an integrated circuit device 10 is shown. The device 10 comprises a semiconductor substrate 12, which is comprised of silicon in the preferred embodiment of the invention. A series of lines 14 of insulating material, comprised of silicon dioxide in the preferred embodiment of the invention, are on a surface 16 of the substrate 12. A series of polycrystalline silicon lines 18 are formed on the surface 16 and on the sidewalls of the silicon dioxide lines 14. The topology of the integrated circuit 10 is such that the polycrystalline silicon lines 18 are substantially coplanar with the silicon dioxide lines 14. This structure is manufactured without any additional photolithographic step required for the polycrystalline silicon definition. Thus, problems relating to resist step coverage and to mask registration are avoided.

Figure 2:
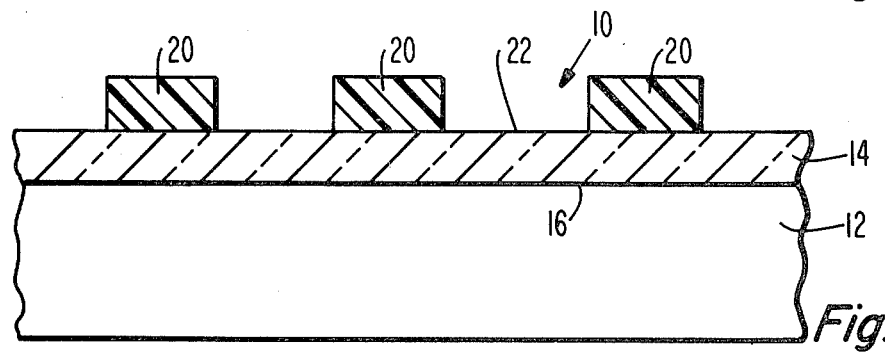
FIGS. 2-4 are cross-sectional views illustrating the method of manufacturing the device shown in FIG. 1.
Figure 3:
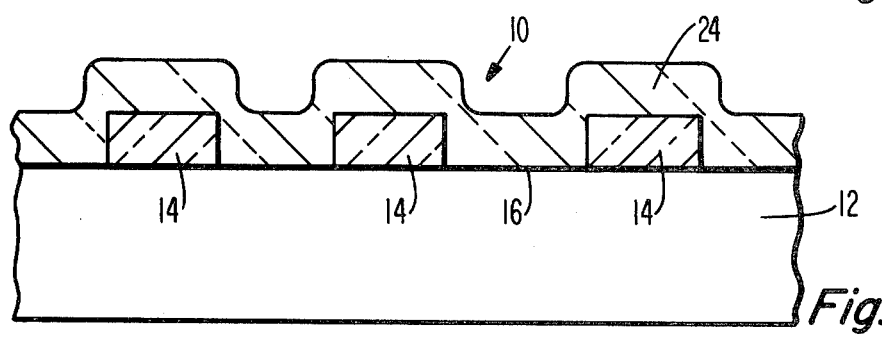
Figure 4:
Figure 4:
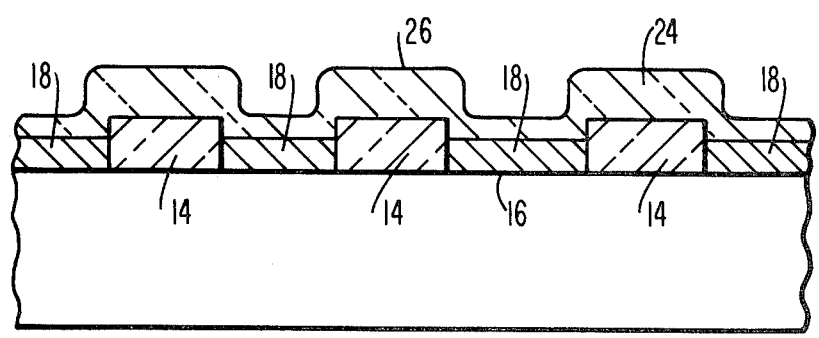

With reference to FIGS. 2-4, the method of manufacturing the device 10 shown in FIG. 1 will be explained. In FIG. 2, the silicon substrate 12 is shown after a silicon dioxide layer 14 has been formed on a surface 16 thereof. The silicon dioxide layer 14 can be formed either by deposition or by thermal oxidation in any manner well known in the art. In the preferred embodiment of the invention, the silicon dioxide layer 14 is formed by the thermal oxidation of the silicon substrate 12. Following the formation of the silicon dioxide layer 14, a photoresist layer (not shown) is applied to the surface 22 of the silicon dioxide layer 14. The photoresist layer is patterned, using standard photolithographic techniques, in order to form a mask 20 which covers those areas of the silicon dioxide layer 14 except where the polycrystalline silicon lines 18 are to be formed. The openings in the photoresist layer expose portions of the silicon dioxide layer 14 which will be removed by etching. Following the etching step, portions of the surface 16 of the substrate 12 will be exposed. Thereafter, the remaining portions of the mask 20 are removed.

Referring to FIG. 3, an amorphous silicon layer 24 is then applied over the surface 16 of the substrate 12 and over the silicon dioxide lines 14. The amorphous silicon layer 24 can be either intrinsic, or it may be doped to have either an N or P type conductivity. As will be explained, the amorphous layer 24 will be converted into a conductive polycrystalline material in the grooves and vias of the patterned areas without any additional photolithographic steps.

Referring now to FIG. 4, the surface 26 of the amorphous silicon layer 24 is subjected to a non-selective laser annealing process (represented by the arrows in FIG. 4), i.e. the entire surface 26 of the amorphous silicon layer 24 is irradiated by a laser. The laser radiation heats the amorphous silicon layer 24 to a temperature greater than about 500° C. As a result of the laser annealing treatment and subsequent cooling to room temperature, the portions of the amorphous silicon layer 24 which are in contact with the underlying silicon substrate are more selectively crystallized than those areas on top of the silicon dioxide islands.

Next, the substrate is placed into an etchant solution which selectively etches amorphous silicon with respect to either polycrystalline silicon or silicon dioxide, thereby resulting in the removal of the portions of the amorphous silicon layer 24 which have not been converted into polycrystalline silicon material 18. As a result, the structure shown in FIG. 1 will usually be formed. However, at somewhat higher laser doses, the alternate embodiment, shown in FIG. 5, which has polycrystalline areas 19 on top of the silicon dioxide lines 14, will be formed. An example of the above invention follows:

EXAMPLES

A thermal oxide was grown to a thickness of 6000 Angstroms on n-type silicon wafers. The oxide layers were then patterned and etched using conventional lithographic methods. A 2000 Angstrom thick film of low pressure chemical vapor deposited (LPCVD) amorphous silicon was deposited by the thermal decomposition of silane ($SiH_4$) at 530° C. and at a pressure of 500 millitorr on the surface of patterned silicon dioxide layers. The samples were then laser annealed using a frequency-doubled Nd:YAG laser operating at a 0.53

μm wavelength. A dose range of 0.1-0.8 J/cm² was employed. The wafers were scanned at a repetition rate of 10 pulses/second and a pulse width of 15 nanoseconds. Lower laser-dosed samples (0.1-0.4 J/cm²) showed the best uniformity, and less extraneous crystallization on top of the silicon dioxide islands. These samples were then etched in a mixture containing nitric, hydrofluoric, and acetic acids. After several minutes, the crystalline material in the grooves and vias on top of the underlying substrate still remained. Amorphous silicon and the less crystalline regions disappeared during the course of the etch. Identical samples that did not undergo the laser anneal treatment had no amorphous or polycrystalline material left after the etch.

Figure 5:
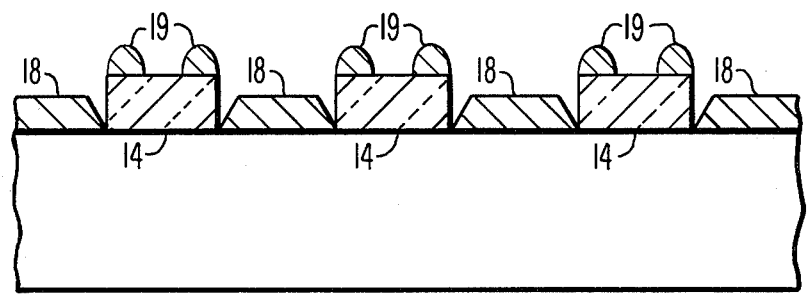
FIG. 5 is a cross-sectional view illustrating an alternative configuration formed with the present invention.

Laser doses in the range of 0.4-0.8 J/cm² produced selective crystallization of portions 19 of the amorphous layer on top of the silicon dioxide islands as shown by the alternate embodiment illustrated in FIG. 5. The exact nature of this structure depends on the dimensions of the silicon dioxide island 14. The small ridges of polycrystalline material 19 left on the top edge of the silicon dioxide islands had a width dimension of 3 to 5 microns. Thus, silicon dioxide islands less than 10 microns in width could be completely covered with the crystalline material. Silicon dioxide island and line features with dimensions greater than 10 microns had areas in their centers where the more amorphous material was completely removed. Sidewalls, however, remained clear of polycrystalline material. Apparently, subsequent heat transfer and cooling processes on top of the silicon dioxide islands and underlying substrate allow for the selective crystallization of a silicon material which exhibits a substantially increased etch resistance when compared to other laser annealed regions of the sample. The difference in the conducting properties of silicon dioxide versus crystalline silicon and the seeding properties of the underlying silicon are probably, in part, responsible for this selective crystallization phenomenon. Uniformity of the laser spot can introduce a variety of other crystallization phenomenon, but the most prominent and prevalent selective crystallization phenomenon and thus the most easy to reproduce are those shown in FIGS. 1 and 5.

While the present invention was explained with reference to a frequency-doubled Nd:YAG laser, other types of lasers, i.e. continuous wave argon lasers, can be used without departing from the inventive concept.

We claim:

1. A method of forming polycrystalline silicon lines and vias on a silicon substrate comprising:
   (a) forming an insulating layer on a surface of said substrate;
   (b) removing areas of said insulating layer where said lines and vias are to be formed;
   (c) depositing an amorphous silicon layer over the surface of said substrate;
   (d) laser annealing said amorphous silicon layer, whereby said portions in contact with said silicon will be selectively converted into polycrystalline silicon; and
   (e) selectively removing the remaining amorphous silicon areas.

2. The method of claim 1 wherein said insulating layer is formed by the thermal oxidation of said silicon substrate.

3. The method of claim 1 wherein said insulating layer is formed by the deposition of silicon dioxide on the surface of said silicon substrate.

4. The method of claim 2 or claim 3 wherein said step of removing areas of said insulating layer is accomplished by etching following a photolithographic exposure of a photoresist layer.

5. The method of claim 4 wherein said amorphous silicon layer is deposited in a low pressure chemical vapor deposition process.

6. The method of claim 5 wherein said laser annealing step is accomplished using a pulsed frequency-doubled Nd:YAG laser.

7. The method of claim 6 wherein said laser is operated at a wavelength of 0.53 μm.

8. The method of claim 7 wherein the dose of said laser is between 0.1 Joules/cm² and 0.8 Joules/cm².

9. The method of claim 8 wherein said selective removal of remaining amorphous silicon areas is accomplished by etching.

10. The method of claim 9 wherein said etching for selective removal of amorphous silicon is conducted in a solution of nitric, hydrofluoric, and acetic acids.

* * * * *